United States Patent [19]
Kato

[11] Patent Number: 5,311,007
[45] Date of Patent: May 10, 1994

[54] COVER FOR SOLID-STATE IMAGE SENSING DEVICE WITH A CONCAVE-SHAPED CROSS-SECTION

[75] Inventor: Kaneyuki Kato, Tokyo, Japan
[73] Assignee: NEC Corporation, Japan
[21] Appl. No.: 997,082
[22] Filed: Dec. 29, 1992
[30] Foreign Application Priority Data
  Jan. 9, 1992 [JP] Japan .................................. 4-1967
[51] Int. Cl.5 ............................................ H01J 40/14
[52] U.S. Cl. ................................ 250/208.1; 257/434
[58] Field of Search ..................... 250/208.1, 214.1; 257/787, 791, 793, 788, 792, 693, 697, 433, 434; 358/98, 229, 213.11

[56] References Cited
U.S. PATENT DOCUMENTS

| | | | |
|---|---|---|---|
| 4,442,456 | 4/1984 | Iwata et al. | 250/208.1 |
| 4,650,285 | 3/1987 | Stevenson | 257/434 |
| 4,839,716 | 6/1989 | Butt | 257/693 |
| 5,072,284 | 12/1991 | Tamura et al. | 257/693 |

*Primary Examiner*—David C. Nelms
*Assistant Examiner*—Que T. Le
*Attorney, Agent, or Firm*—Laff, Whitesel, Conte & Saret

[57] ABSTRACT

A solid-state image sensing element is disposed below and tightly enclosed with an optically transparent cover in order to protect the element from the outside, the cover being integrally formed into an inverse U-shape in a cross-section. The cover is made of plastics having good light transmissivity. The solid-state image sensing element is mounted on a substrate and is electrically connected thereto through metal wires. The above-mentioned transparent cover is adhered on the substrate through an adhesive such as an epoxy resin or the like so that the element is tightly enclosed. Thus, there is provided a solid-state image sensing device which is light in weight and can be fabricated at a low cost.

16 Claims, 5 Drawing Sheets

COVER FOR SOLID-STATE IMAGE SENSING DEVICE WITH A CONCAVE-SHAPED CROSS-SECTION

BACKGROUND OF THE INVENTION

1. Field of the Invention

This invention relates to a solid-state image sensing device and in particular to a package structure of a solid-state image sensing device which is light in weight.

2. Description of the Prior Art

In a solid-state image sensing device of the prior art, a solid-state image sensing element 1 is packaged on a ceramic substrate 11 through an adhesive and is connected to external terminals through metal connecting wires 4 and lead frames 9, as shown in FIGS. 1A and 1B. One end of each lead frame 9 and is connected to the metal wire 4 on the substrate 11, and the remaining part of the lead frame 9 is drawn out and is connected to the external terminal. The image sensing device is provided with a dam frame 10, on top of the lead frames 9 on the substrate 11, which is adhered through an adhesive such as a low melting point glass or the like, and further is provided with a cover 3 which is adhered to top of the dam frame 10 through the low melting point glass as mentioned above.

In the above-mentioned prior solid-state image sensing device, there were some problems that the cover 3 must be in a shape of a flat plate since the cover 3 is made of a surface-processed glass, that the production cost is high since the dam frame 10 must be mounted on top of the lead frames 9 so that the solid-state image sensing element 1 and metal wires 4 are not crushed before the cover 3 is mounted, and that the element 1 must be separated from the dam frame 10 to a certain degree since a tool for mounting the metal wires 4 hits the dam frame 10, for example, in a step of connecting the element 1 to the substrate 11.

In addition, if an inorganic material, such as ceramics or the like, which has the coefficient of expansion close to that of glass, is not used as a material for the substrate 11, the cover 3 is cracked during a temperature cycle test since the cover 3 is made of glass. For this reason, there was a problem that the whole package weighs heavier.

SUMMARY OF THE INVENTION

It is an object of this invention to provide a solid-state image sensing device which is light in weight and can be fabricated at a low cost.

The above-mentioned object is accomplished by providing a solid-state image sensing device comprising a substrate, a solid-state image sensing element fixed on the substrate and a cover disposed above the element and having high light transmissivity, the cover having a concave-shaped cross-section with a flat top portion of a length corresponding to at least a width of the image sensing element.

The cross-section of the cover may be of an H shape.

The cover is made of a resin such as a polyolefin, polycarbonate, polymethyl methacrylate or epoxy resin or the like which has high light transmissivity.

DETAILED DESCRIPTION OF THE PREFERRED EMBODIMENTS

Figure 5A:
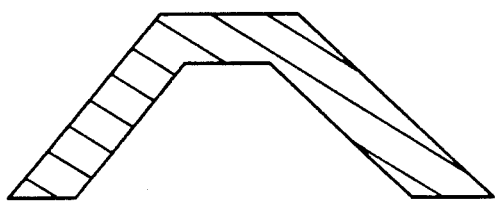
FIGS. 5A and 5B illustrate a V-shaped and an H-shaped cross section of a cover disposed above a solid state sensing element.

According to this invention, a solid-state image sensing device comprises a substrate, a solid-state image sensing element mounted and fixed in place on the substrate, metal wires for connecting the image sensing element to the substrate, and an optically transparent cover for tightly enclosing the image sensing element from above, the cover being formed into a concave shape or an H shape (FIG. 5B) in a cross-section. The concave-shaped (FIG. 5A) cross-section includes, for instance, an inverse U- or V-shaped cross-section or the like with a flat top portion having a length corresponding to at least a width of the image sensing element.

For the substrate, it is possible to use substrates made of organic materials, for instance, a copper-clad paper-resin laminate such as a copper-clad paper-phenol, polyester or epoxy laminate or the like; a copper-clad glass-resin laminate such as a copper-clad glass-epoxy, polyimide, triazin or Teflon (trade mark, Du Pont Co. Ltd.) laminate or the like; and a copper-clad composite laminate such as a copper-clad paper-glass-epoxy laminate or the like.

The above-mentioned transparent cover is disposed above the solid-state image sensing element in order to protect the element from the outside, and is adhered onto the substrate through an adhesive such as an epoxy resin or the like so that the imaging sensing element is tightly enclosed. The cover is made of a resin such as a polyolefin, polycarbonate, polymethyl methacrylate or epoxy resin or the like which has high light transmissivity. The solid-state image sensing element is packaged on the substrate and is electrically connected thereto through metal wires or the like.

Next, this invention will be described in more detail with reference to drawings. The same allocated reference numbers in the drawings show the same members throughout the drawings.

Figure 1A:
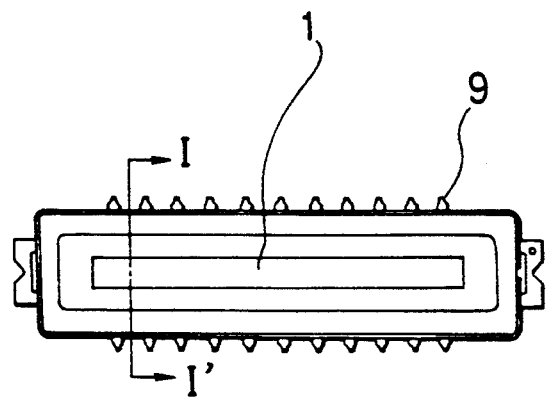
FIG. 1A shows a top view of a solid-state image sensing device of the prior art.
Figure 1B:
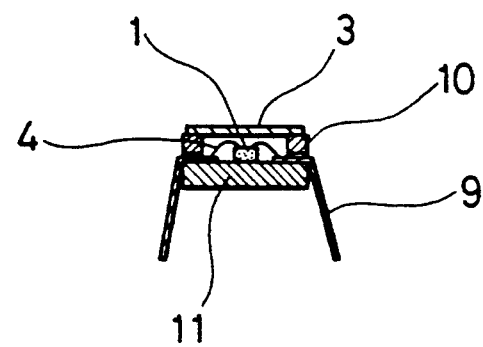
FIG. 1B shows a cross-sectional view of the solid-state image sensing device taken along a line I—I' in FIG. 1A.
Figure 2A:
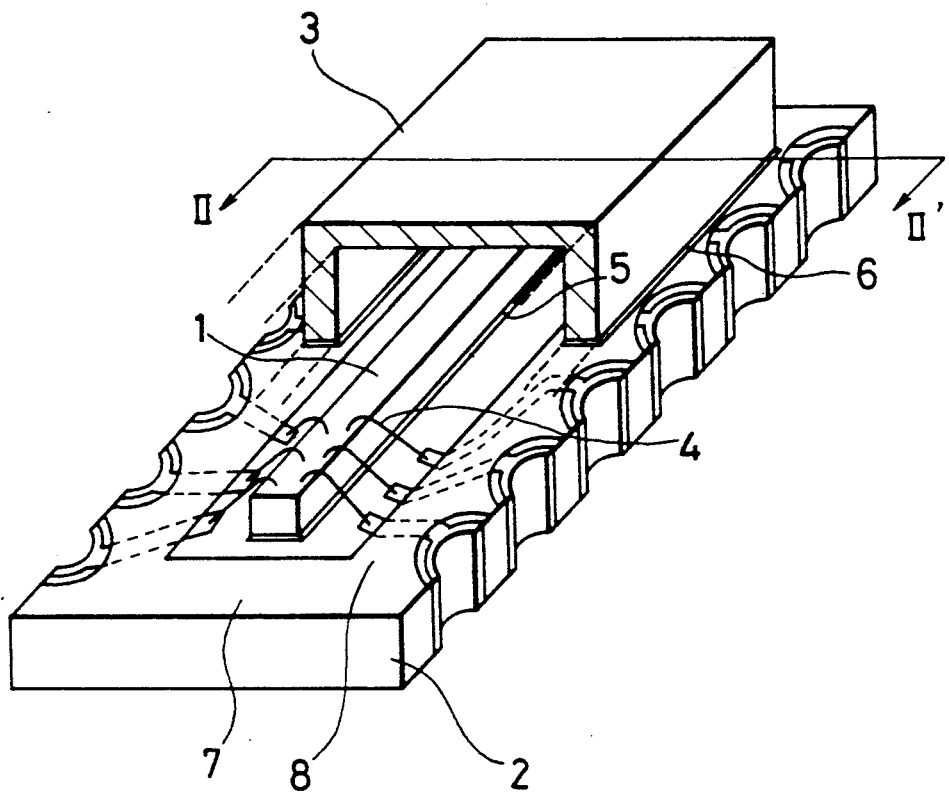
FIG. 2A shows a perspective view of a first embodiment of a solid-state image sensing device according to this invention, in which a cover is cut off halfway.
Figure 2B:
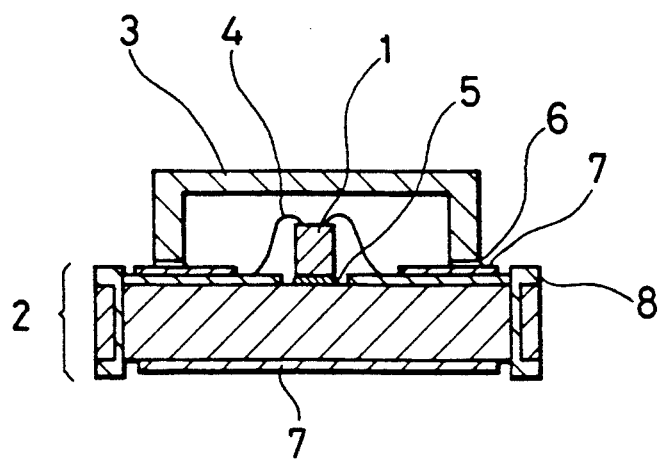
FIG. 2B shows a cross-sectional view of the solid-state image sensing device taken along a line II—II' in FIG. 2A.

Referring now to FIGS. 2A and 2B, there is shown a first embodiment of a solid-state image sensing device according to this invention. In FIG. 2A, a cover is cut off halfway in order to make the structure of the image sensing device clear.

In the solid-state image sensing device according to the first embodiment of this invention as shown in FIGS. 2A and 2B, there is provided a substrate 2 comprising a copper-clad glass epoxy laminate with interconnections or wirings 8 formed according to a known photolithography or the like, a prescribed area on top of the laminate being covered with an insulating resin layer 7 formed of a resin such as an epoxy resin or the like. A solid-state image sensing element 1 is mounted in place on top of the substrate 2, from which copper is removed by etching, through an epoxy adhesive 5. The solid-state image sensing element 1 is electrically connected to the substrate 2 through metal wires 4 and further to external connecting terminals provided on sides of the substrate 2.

Figure 3:
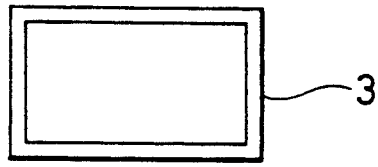
FIG. 3 a bottom view of a cover used in the first embodiment of this invention.

The solid-state image sensing element 1 is covered with a cover 3 so that the element is protected from the outside. The cover 3 is made by integrally molding an polyolefin resin which has light transmissivity of about 90% or more and is excellent in optical properties such as refractive index and birefringence etc. The cover 3 has an inverse U-shaped cross-section with a flat top portion and is provided with a hollow within a mass or in a surface, i.e. a recess of a rectangular parallelpiped-shaped structure so that it does not come in contact with the solid-state image sensing element 1 and the metal wires 4. Referring now to FIG. 3 which shows the cover 3 viewing from downward, there is seen a rectangular opening of the recess. The recess is about 0.6 mm or more in depth considering an element thickness and a metal wire height, and a width of a joint area between the cover 3 and the substrate 2 (i.e. a thickness of a side portion of the cover 3) is about 1 mm or more so that a penetration path of moisture, oil, liquid, gas or the like becomes longer.

In the first embodiment, the polyolefin resin is used as a material for making the cover but it is also possible to use any suitable optical material such as a polycarbonate resin (PC), polymethyl methacrylate resin (PMMA) or epoxy resin, which has high light transmissivity.

The cover 3 is adhered onto the insulating resin layer 7 of the substrate 2 through an epoxy adhesive 6. If the cover 3 is adhered to even a part of the interconnection 8, a layer of the adhesive 6 is peeled off or delaminated from the interconnections 8 during a temperature cycle test or the like, resulting in a cause of detectives due to penetration of moisture or the like.

For a lead shape of the package, the present embodiment uses an LCC (Leadless Chip Carrier) type wherein external connecting terminals are provided on the sides of the substrate, but the same effect as in the present embodiment can be also attained by using a DIP (Dual Inline Package) type, as mentioned below, wherein pins are provided on both sides of IC and an SOP (Small Outline Package) type wherein lead frames are provided on opposite sides of IC.

Figure 4A:
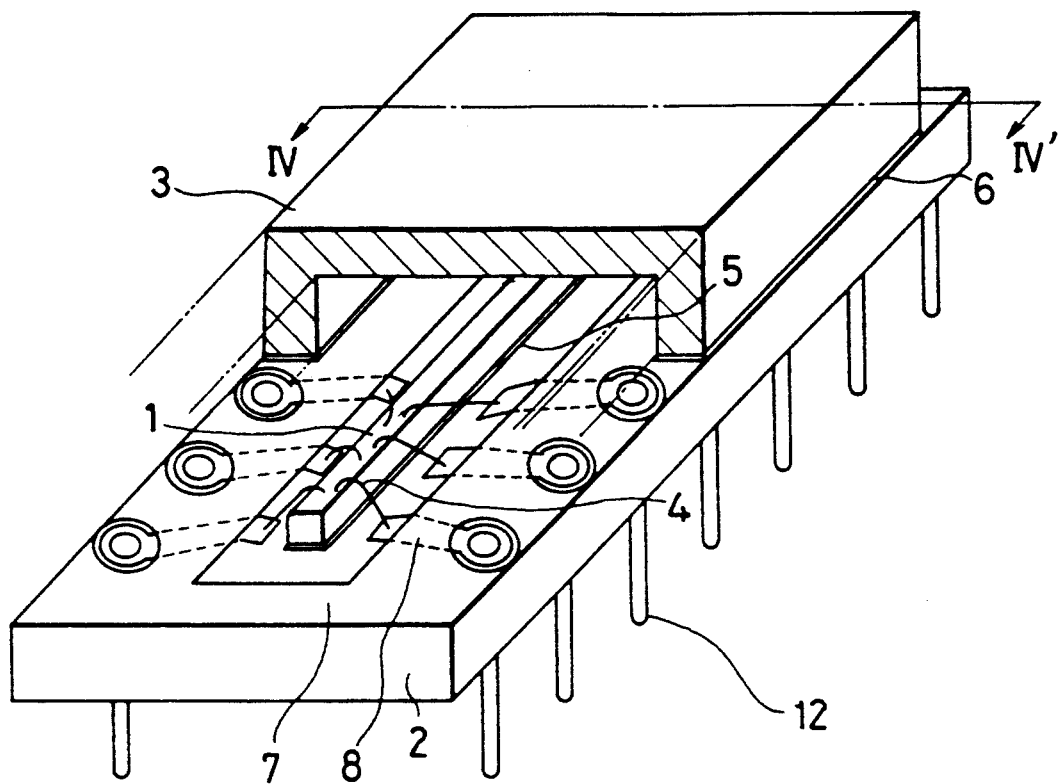
FIG. 4A shows a perspective view of a second embodiment of a solid-state image sensing device according to this invention, in which a cover is cut off halfway.
Figure 4B:
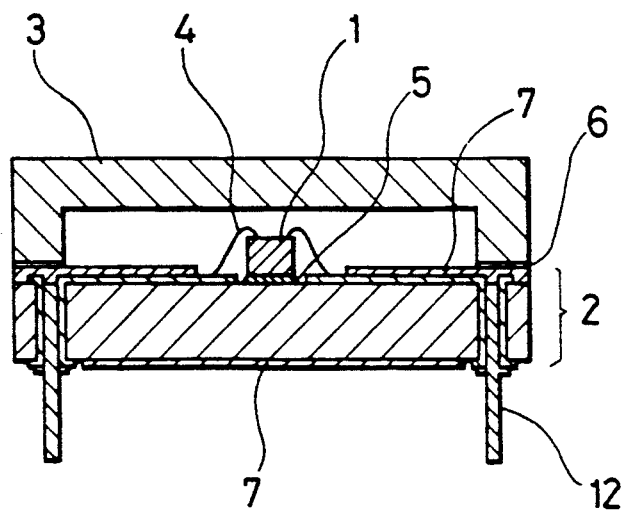
FIG. 4B shows a cross-sectional view of the solid-state image sensing device taken along a line IV—IV' in FIG. 4A.

A second embodiment of this invention will be described with reference to FIGS. 4A and 4B which show a perspective and cross-sectional views of another solid-state image sensing device according to this invention, respectively. In FIG. 4A, a cover is cut off halfway in order to make the structure of the image sensing device clear.

In the second embodiment using the above-mentioned DIP type, the solid-state image sensing device is substantially similar to that of the first embodiment, except that the substrate 2 is provided with lead pins 12 so that excess heating is not applied to the cover 3 during packaging, the lead pins 12 coming in contact with the interconnections 8. The cover 3 has a heat-resistant temperature of about 120° C. and thus it is necessary that temperature higher than 120° C. is not applied to the cover. The lead pins 12 is electrically connected to interconnections 8.

In place of the cover having the inverse U-shaped cross-section as used in the first and second embodiments, for instance, there may be used a cover having an inverse V-shaped cross-section with a flat top portion and which is provided with a recess of a trapezoid-shaped structure in a cross-section, or a cover having an H-shaped cross-section and being provided with a recess. These covers can be also made by integrally molding the above-mentioned resins in the same manner as in the first and second embodiment. These covers attain the same effect as in the above-mentioned embodiments.

Figure 5B:
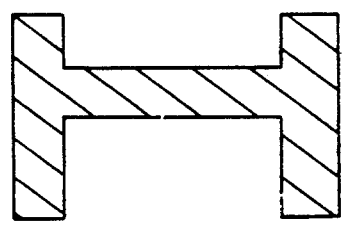

As discussed above, in the solid-state image sensing device of this invention, the solid-state image sensing element which is mounted on and electrically connected to the substrate is tightly enclosed with the optically transparent cover from above in order to protect the element from the outside, the cover having the concave-shaped cross-section such as the inverse U- or V-shaped cross-section (FIG. 5A) or the like, or the H shaped cross-section (FIG. 5B). Therefore, the image sensing device of this invention can be fabricated at a lower cost by about 20% than in the prior art, and further it is light in weight since an inorganic material such as glass and ceramics is not used. The solid-phase image sensing device can be used in a field of, for example, electronic equipments such as facsimiles, image scanners or the like.

While this invention has been particularly described with reference to the preferred embodiments thereof, it will be understood by those skilled in the art that the foregoing and other changes in form and details may be made therein without departing from the spirit and scope of the invention.

What is claimed is:
1. A solid-state image sensing device comprising:
a substrate;
a solid-state image sensing element fixed in place on said substrate; and
a cover disposed above said element and having high light transmissivity, said cover comprising a flat top portion and a side-wall portion surrounding said element to provide a concave-shaped cross-section, said side-wall portion being integrally formed with said top portion, said flat top portion having ga length corresponding to at least a width of said image sensing element.
2. The solid-state image sensing device as defined in claim 1 in which said cover is formed of a polyolefin resin.
3. The solid-state image sensing device as defined in claim 1 in which said cover is formed of a resin selected from a group consisting of a polycarbonate resin, a polymethyl methacrylate resin, and an epoxy resin.
4. The solid-state image sensing device as define din claim 1 in which said cover has light transmissivity of about 90% or more.
5. The solid-state image sensing device as defined in claim 1 in which said cover is adhered, through an epoxy adhesive, onto an insulating resin layer of said substrate so that said image sensing element is tightly enclosed.
6. The solid-state image sensing device as defined in claim 1 in which said concave-shaped cross-section is an inverse U- or V-shaped cross-section, or an H-shaped cross-section.

7. The solid-state image sensing device as defined in claim 1 in which said cover has an inverse U-shaped cross-section with a flat top portion and be provided with a recess having a rectangular parallel pipe-shaped structure, said recess having depth of about 0.6 mm or more and a width of a joint area between said cover and said substrate is about 1 mm or more.

8. The solid-state image sensing device as defined in claim 1 in which said substrate comprises a copper-clad glass epoxy laminate.

9. The solid-state image sensing device as defined in claim 1 in which a lead shape of said image sensing device is of a leadless chip carrier type.

10. The solid-state image sensing device as defined in claim 1 in which a lead shape of said image sensing device is of a dual inline package type.

11. The solid-state image sensing device as defined in claim 1 in which a lead shape of said image sensing device is of a small outline package type.

12. A solid-state image sensing device comprising:
a substrate;
a solid-state image sensing element fixed in place on said substrate; and
a cover disposed above said element and having high light transmissivity, said cover being of an H shape in a cross-section and being integrally formed as a whole.

13. A solid-state image sensing device comprising:
a substrate comprising a copper-clad glass epoxy laminate with interconnections and an insulating resin layer formed in place on said laminate, a part of said interconnections being disposed under said insulating resin layer;
a solid-state image sensing element fixed in place on said substrate;
metal wires for electrically connecting said solid-state image sensing element to said interconnections; and
a cover disposed above said solid-state image sensing element and adhered onto said insulating resin layer, said cover having light transmissivity of about 90% or more, having an inverse U-shaped cross-section with a flat top portion and being provided with a recess having a rectangular parallelpiped-shaped structure, said cover being integrally formed as s whole said recess having a depth of about 0.6 mm or more, and a width of a joint area between said cover and said insulating resin layer being about 1 mm or more.

14. The solid-sate image sensing device as defined in claim 13 in which said substrate is provided with lead pins coming in contact with said interconnections.

15. The solid-state image sensing device as defined in claim 13 in which said cover is formed of a polyolefin resin.

16. The solid-state image sensing device as defined in claim 13 in which said cover is formed of a resin selected from a group consisting of a polycarbonate, polymethyl methacrylate, or an epoxy resin.

* * * * *